United States Patent [19]

Hoffmann et al.

[11] 4,334,236

[45] Jun. 8, 1982

[54] ONE-TRANSISTOR DYNAMIC RAM WITH POLY BIT LINES

[75] Inventors: Kurt Hoffmann, Taufkirchen; Heinrich Schulte, Munich, both of Fed. Rep. of Germany

[73] Assignee: Siemens Aktiengesellschaft, Berlin & Munich, Fed. Rep. of Germany

[21] Appl. No.: 67,926

[22] Filed: Aug. 20, 1979

[30] Foreign Application Priority Data

Aug. 30, 1978 [DE] Fed. Rep. of Germany ....... 2837877

[51] Int. Cl.³ .................. H01L 27/10; H01L 29/04; G11C 11/40
[52] U.S. Cl. ............................. 357/59; 29/571; 357/45; 357/68; 365/149; 357/23
[58] Field of Search ................ 357/23, 24, 41, 59; 365/182, 186, 149

[56] References Cited

U.S. PATENT DOCUMENTS 4,012,757  3/1977  Koo .................................. 357/24
4,240,195 12/1980  Clemens et al. ................. 357/59 R

OTHER PUBLICATIONS

Mitterer et al., "MOS-RAM . . . Doppel-Polysi . . . ", Elektronik-Anzeiger vol. 9, No. 7, Jul. 1977, pp. 19-22.
Fortino et al., IBM Technical Discl. Bulletin, vol. 20, No. 2, Jul. 1977, pp. 539-540.
Ho et al., IBM Technical Discl. Bulletin, vol. 20, No. 1, Jun. 1977, pp. 146-148.
Ahlquist et al., IEEE Int. Solid-State Circuits Conf., 1976, Digest of Technical papers, pp. 128-129, Feb. 1976.

*Primary Examiner*—William D. Larkins
*Attorney, Agent, or Firm*—Hill, Van Santen, Steadman, Chiara & Simpson

[57] ABSTRACT

An MOS integrated semiconductor memory is disclosed with memory locations arranged in lines and columns. The memory locations in each case contain two one-transistor memory cells. For each memory location, two MOS transistors of the two one-transistor memory cells are controlled in common by means of a word line which runs in a line direction. The two MOS transistors are each coupled on a respective bit line which runs on one side of the memory locations in a column direction. Electrodes of the MOS memory capacitors and the gates of the MOS transistors of the one-transistor memory cells are formed by a first polysilicon layer and a second polysilicon layer, respectively. For reduction of area and also of bit line capacitance as well as at the same time raising the memory capacitance, the invention provides that the bit lines are provided as a third polysilicon layer forming polysilicon paths, and that the polysilicon paths which form the bit lines are coupled on only via limited doped connection zones in a semiconductor substrate which contains the memory cells of the MOS transistors.

3 Claims, 8 Drawing Figures

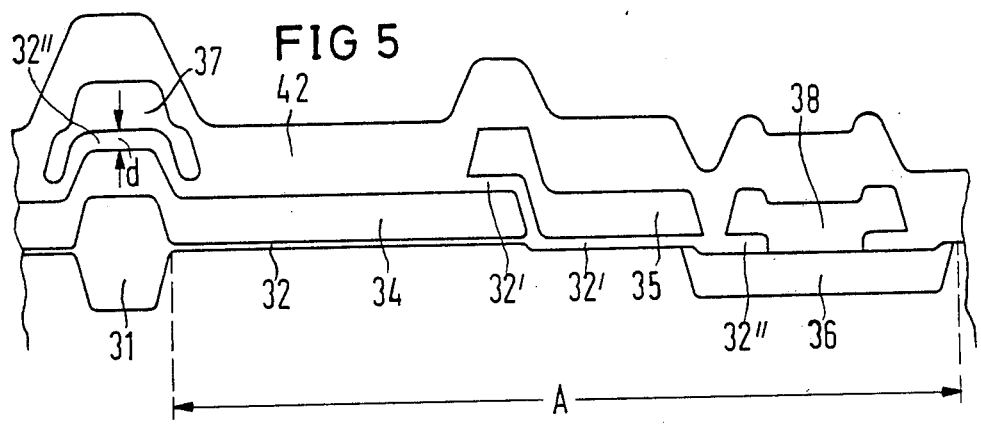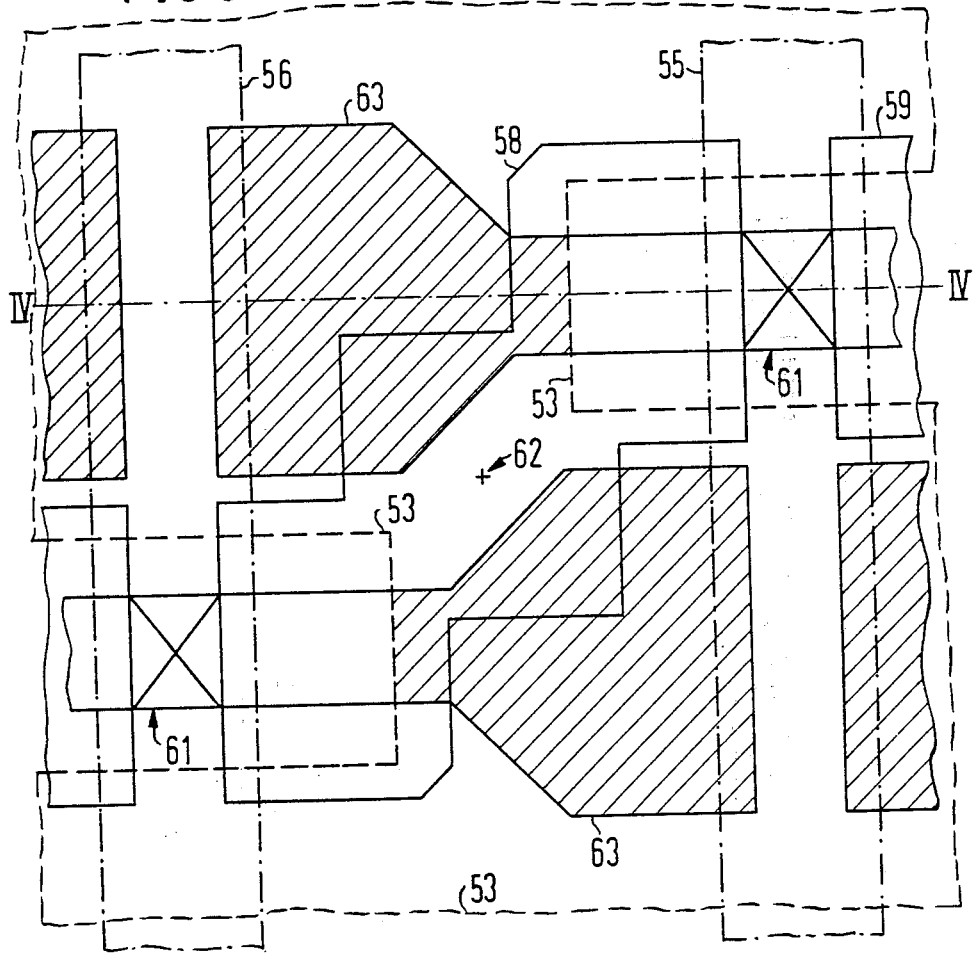

ONE-TRANSISTOR DYNAMIC RAM WITH POLY BIT LINES

BACKGROUND OF THE INVENTION

The present invention concerns a MOS integrated semiconductor memory with memory locations arranged in lines and columns. Each memory location contains two one-transistor memory cells, whereby per memory location in each case two MOS transistors of the two one-transistor memory cells are selectable together by means of a word line which preferably runs in a line direction. The two MOS transistors in each case are coupled onto a bit line at each side of the memory location and which runs preferably in a column direction. Gates of the transistors and one electrode of the memory capacitors of the on-transistor memory location are each formed by a second polysilicon layer and a first polysilicon layer, respectively.

The essential construction of one transistor memory cells is known from "Siemens Research and Development Report", volume 4, (1975), No. 4, pages 197 to 202, incorporated herein by reference.

Further, MOS integrated semiconductor memories of the above mentioned kind are known from "1976 I.E.E.E. International Solid-State Circuits Conference", pages 128 and 129, incorporated herein by reference.

The principle construction of a single one-transistor memory cell of such a semiconductor memory may be seen in the perspective representation according to FIG. 1. There, in a semiconductor substrate 10, which consists, as a rule of silicon, an active area 12 for the one-transistor memory cell is defined by means of local thick oxide 11 (produced according to the so-called Locos method). Above this active area there are located a first conducting layer 15 of polycrystalline silicon, which represents an electrode of the memory capacitor of the one-transistor memory cell, as well as a second layer 16 out of polycrystalline silicon, which forms the gate electrode of the MOS transistor of the one-transistor memory cell. By means of insulating layers 13 and 14 (as a rule silicon dioxide layers), the layers 15 and 16 are separated both from the active layer 12 as well as from one another. The layers 15 and 16 lie in each case in a common plane. On each side of the one transistor memory cell, a bit line 17 or 18 is provided as shown. The bit line 18 is associated with the one-transistor memory cell shown, whereas the bit line 17 is associated to a further one-transistor memory cell, not shown here, which is provided at the memory location with the one-transistor memory cell shown. For selection of the one-transistor memory cells via the gates of the transistors, perpendicular to the bit lines 17 and 18 there is a metal word line 20 which is insulated by means of an insulation layer 19. Word line 20 contacts the gate electrode 16 of the MOS transistor of the one-transistor memory cell at location 21.

The layout of two one-transistor memory cells in one memory location of the semiconductor memory is visible in the top view of FIG. 2. Here, the same elements as in FIG. 1 are provided with the same reference symbols. From this illustration, one can see how the first conducting layer 15 represented with a dotted line is structured out of polycrystalline silicon, in order to form an electrode of two MOS memory capacitors from two one-transistor memory cells which are provided in one memory location. The second conducting layer 16 of polycrystalline silicon, which is represented with an unbroken line, is correspondingly structured in order to form a cohesive gate (transfer gate) for the two MOS transistors of the one-transistor memory cell which is encompassed in one memory location.

The two bit lines 17 and 18 are diffused zones and run in each case on one side of the memory cells. The diffusions in the area of the transfer gate which is formed by the second conducting layer 16 out of polycrystalline silicon extend up to this second conducting layer.

The word line 20 which is not represented in FIG. 2 runs vertically over the bit lines 17 and 18, whereby the contacting proceeds with the transfer gate which is formed by the second conducting layer 16 out of polycrystalline silicon at the contact location 21. Areas 22 and 22' which are represented in hatched form, show the active areas of the MOS memory capacitors of the one-transistor memory cells. In the case of a semiconductor memory of the above type, a relatively large area requirement results because of the direction of the bit lines as diffused zones on, in each case, one side of the memory cells. Above and beyond this, the memory capacitance is limited because of the dimensions of the first conducting layer 15 of polycrystalline silicon which is limited by the bit lines. Also a capacitance of the bit line is relatively large.

SUMMARY OF THE INVENTION

It is an object of this invention to provide a semiconductor memory as described above with a smaller area requirement and at the same time an increased memory capacitance as well as a decreased bit line capacitance.

This problem is solved in the case of a MOS integrated semiconductor memory of this invention since the bit lines run in a third plane as polysilicon channels. These polysilicon channels which form the bit lines are coupled onto the MOS transistor only via limited doped connection zones in a semiconductor substrate which contains the memory cells.

In the case of a method for the production of a semiconductor memory of the above described type, according to an embodiment of the invention after separation of areas of a semiconductor substrate as active areas of one-transistor memory cells by means of local oxidation (Locos process) with thick oxide, a first insulating layer is applied, for example, an oxide layer with a thickness of preferably 500 Å, onto the semiconductor substrate. Onto the first insulating layer a first conducting layer of polycrystalline silicon is applied and is structured for the formation of electrodes of the MOS memory capacitors. For the production of the gate insulator of the MOS transistors of the one-transistor memory cells, a second insulating layer is applied which covers active areas of one of the transistor memory cells which are not covered by this first conducting layer. A second conducting layer of polycrystalline silicon is applied and is structured for the formation of gate electrodes of the MOS transistors. After doping of areas of the one transistor memory cells which are not covered by the structured first and second conducting layers, for the formation of connection zones between the bit lines and the MOS transistors of the one-transistor memory cells, a third insulating layer is applied which covers the first and second conducting layers as well as the connection zones and is produced in these contact windows for the contacting of the connection zones. Onto the third insulating layer, a third conducting layer of polycrystalline silicon is applied and is structured for the formation of bit lines, which contact the connection zones.

According to another embodiment of the invention, after separation of areas of a semiconductor substrate as active areas of one transistor memory cells by means of oxidation (Locos process) with a thick oxide, onto the semiconductor substrate a first insulating layer, for example, an oxide layer with a thickness of preferably 500 Å is applied. Onto the first insulating layer a first conducting layer of polycrystalline silicon is applied and is structured for the formation of electrodes of the MOS memory capacitors. Then a second insulating layer is applied which covers the first conducting layer as well as the active areas of one-transistor memory cells which are not covered. In the area of the one transistor memory cells, for the formation of connection zones between the bit lines and the MOS transistors of the one-transistor memory cells, in the second insulating layer windows are opened and onto this structured second insulating layer a second conducting layer out of polycrystalline silicon is applied. This layer is doped with a doping substance for the formation of the connection zones and is structured for the formation of the bit lines. The insulating layers are then removed from the first and second conducting layers as well as from the active areas not covered by these first and second conducting layers. A third insulating layer is applied for the production of the gate insulator for the MOS transistors of the one-transistor memory cells. For the production of the connection zones, a diffusion proceeds outward from the second conducting layers which form the bit lines on the semiconductor substrate. After this, onto the third insulating layer, a third conducting layer of polycrystalline silicon is applied and is structured for the formation of gate electrodes of the MOS transistors.

BRIEF DESCRIPTION OF THE DRAWINGS

FIG. 5 shows a detailed sectional view in the plane III—III of FIG. 3 for explanation of the production method for this embodiment of the semiconductor memory according to the invention;

FIG. 6 shows a top view of a portion of a further embodiment of the semiconductor memory according to the invention;

DESCRIPTION OF THE PREFERRED EMBODIMENTS

Figure 1:
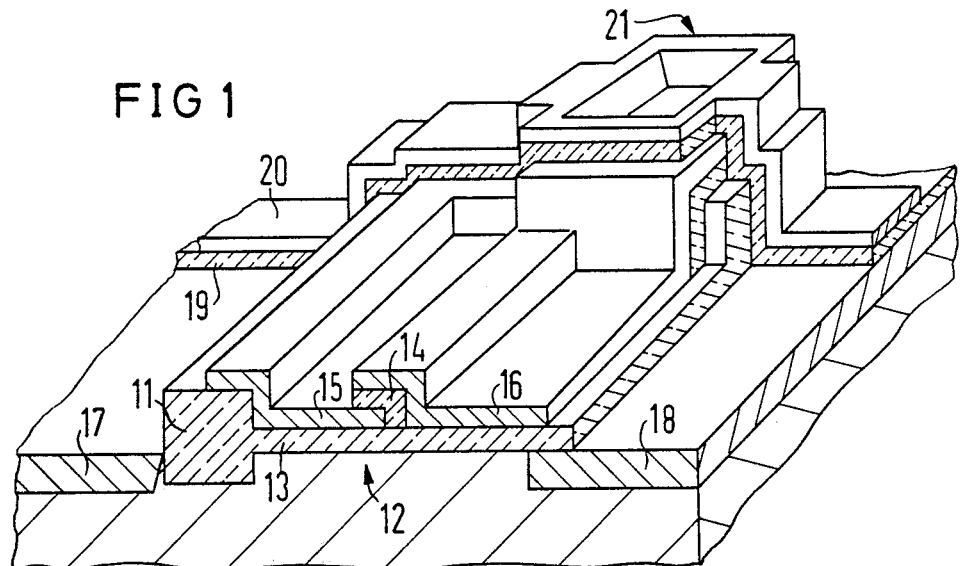
FIG. 1 is a perspective view and FIG. 2 a top view of a prior art semiconductor memory.

According to FIGS. 3 through 6, a first conducting layer 34 of polycrystalline silicon (represented in FIG. 3 with a broken line) forms an electrode for, in each case, two MOS memory capacitors of two one-transistor memory cells which are encompassed in one memory location. A second conducting layer 35 of polycrystalline silicon (represented in FIG. 3 with a solid line) forms the transfer gate of two MOS transistors of two one-transistor memory cells which are encompassed in one memory location. Bit lines 37 and 38 (represented in FIG. 3 with a dot-dash line), which are produced out of a correspondingly structured third conducting layer of polycrystalline silicon, run vertically in the drawing plane in the column direction in each case on one side of the one-transistor memory cells which are encompassed in the memory locations. These bit lines 37 and 38 contact doped zones 36 and thus are in electrical connection with the channel of, in each case, a MOS transistor memory cell. The transfer gates formed by means of the second conducting layer 35 out of polycrystalline silicon are contacted at a location 40, as this is indicated schematically in FIG. 3 by means of a cross. Finally, in FIG. 3, active areas 41 for the MOS memory capacitors are represented which are insulated from the remaining elements of the one-transistor memory cells by means of insulating layers (which for reasons of clarity are not represented in detail in FIGS. 3 through 5).

In particular, with the use of FIG. 5, in the following a method of production is explained for the embodiment of the semiconductor memory according to the invention which is under consideration.

By means of a method which is for the most part known, first, with the help of a local oxidation (Locos process) active areas of one-transistor memory cells which are designated A, are separated from one another by means of areas with relatively thick oxide 31. Then, onto the semiconductor substrate 30, a first insulating layer 32, which, for example, can be formed by means of an oxide with a thickness of approximately 500 Å, is applied, after which onto this insulating layer 32, a first conducting layer of polycrystalline silicon is deposited. This conducting layer of polycrystalline silicon is structured in a manner which is essential known by means of a masked etching process, so that electrodes 34 for the MOS memory capacitors of the one-transistor memory cells arise. Then, a second insulating layer is applied which completely covers the first structured conducting layer 34 of polycrystalline silicon, and at the same time the parts of the active area A of the semiconductor substrate 30 which are not covered by this structured conducting layer 34 arise. The part of this second insulating layer which covers the first structured conducting layer 34 of polycrystalline silicon is designated 32'. This insulating layer also covers the remaining active area A.

Following this, a second conducting layer of polycrystalline silicon is deposited and structured such that the transfer gates 35 for the MOS transistors of the one-transistor memory cells arise. Upon this layer, in a known manner the parts of the active area A which are not covered by the conducting layers 34 and 35, are doped, possibly with an ion implantation process, whereby the doped zones 36 arise.

In the following step, the doped zones 36 of the semiconductor substrate 30 as well as the exposed conducting layers 34 and 35 of polycrystalline silicon are oxidized. In the area of doped zones 36 as well as in the area above thick oxide 31, this third insulating area is designated 32''. With the help of a photo-lithographic process which is known, in the area of doped zones 36 contact windows are opened for bit lines 37 and 38, after which a third conducting layer of polycrystalline silicon is deposited, doped, and structured for the formation of the bit lines 37 and 38.

The oxide layer 32', represents the gate oxide of transfer transistors, preferably has a thickness of 1000 Å.

For completion of the semiconductor memory, the production method proceeds according to known processes with the depositing of an insulating layer 42 (only represented in FIG. 5) and the formation of contact windows for the metallizing.

Figure 7:
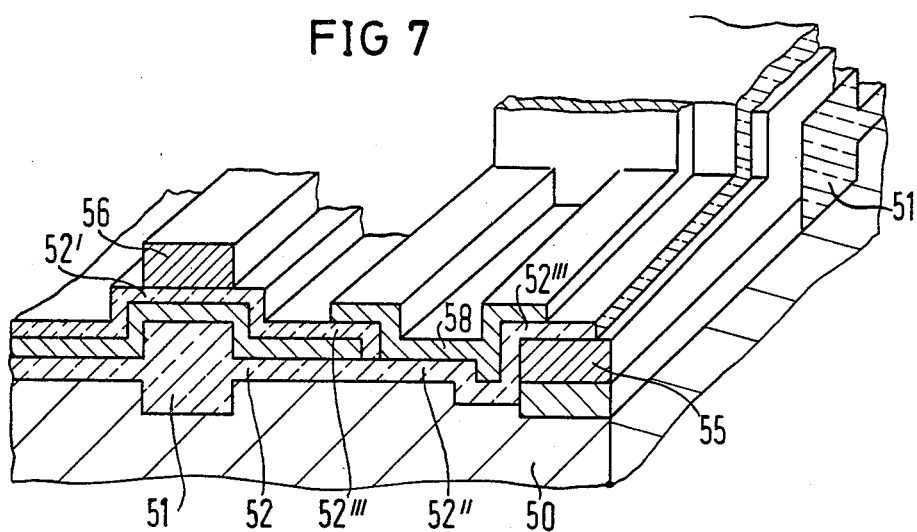
FIG. 7 shows a perspective illustration of the embodiment form of the semiconductor memory according to FIG. 6 according to the invention.
Figure 8:
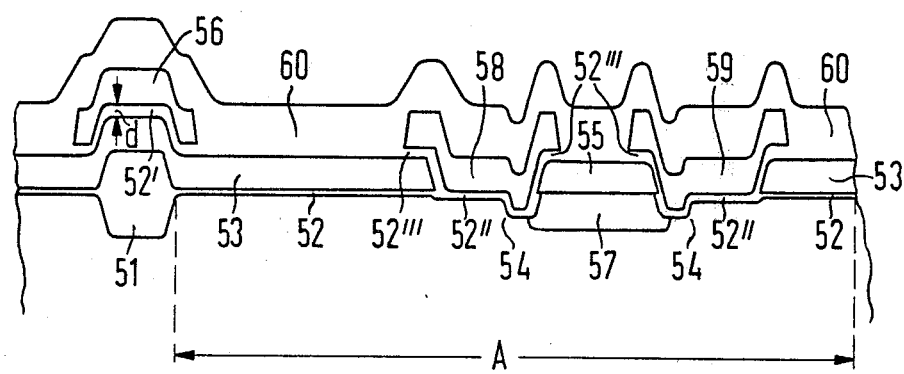
FIG. 8 shows a section in a plane VI—VI in FIG. 6 for explanation of the production method of this embodiment of the semiconductor memory according to the invention.

For the embodiment of a semiconductor memory of the invention according to the FIGS. 6 through 8, a correspondingly structured first conducting layer 53, which is represented in FIG. 6 with a broken line, forms the electrode for MOS memory capacitors of the one-transistor memory cells, and wherein at each memory location again 2 one-transistor memory cells are encompassed. In the drawing plane, conducting paths 55 and 56, which run vertically in the column direction and which are of polycrystalline silicon (in FIG. 6, represented with dash-dot lines), form the bit lines of the memory. A further conducting layer 58, or respectively, 59 of polycrystalline silicon, is represented in FIG. 6 with a solid line, and forms in each case the transfer gate for two MOS transistors of two one-transistor memory cells which are encompassed in one memory location. At contact locations 61, the bit lines 55 and 56 are in electrical contact with doped zones 57 (see FIGS. 7 and 8) and thus with the channel of the MOS transistors of the one transistor memory cells. The contacting of transfer gates 58, or respectively, 59, proceeds at locations 62 which are indicated in FIG. 6 schematically by means of a cross.

In the following, particularly with use of FIG. 8, a method for the production of the embodiment of the semiconductor memory according to the invention which is being considered here is specified.

Also in the case of this embodiment, first according to a method which is known, with the help of a localized oxidation (Locos process), active areas which are designated with A are separated from one another by means of areas with relatively thick oxide 51. Then, onto the semiconductor substrate 50 which is thus prepared, a first insulating layer 52 is applied which, for example, can be formed by means of an oxide layer with a thickness of approximately 500 Å. Onto this first oxide layer 52 a first conducting layer of polycrystalline silicon is deposited and is structured for the formation of electrodes 53 of MOS capacitors of one-transistor memory cells. After this structuring, a second insulating layer 52' is formed, which completely covers the electrodes 53 of polycrystalline silicon. In the insulating layer which arises at the same time on semiconductor substrate 50, with the help of photo-lithographic methods, a window 54 is etched. Then, a second conducting layer of polycrystalline silicon is deposited, for example, doped with As (Arsenic) ions by means of ion implantation, and, with the help of an essentially known photo-lithographic method, is structured for the formation of bit lines 55 and 56. In the area of the window 54, the structure which arises in the polycrystalline silicon 55 is somewhat smaller than window 54. The etching method (for example, a wet chemical etching or a plasma etching) can be chosen such that the etching rate of polycrystalline silicon and the silicon of the substrate 50 practically do not differ from one another. In the case of the etching of the second conducting layer of polycrystalline silicon for the production of bit lines 55 and 56, in the overlapping window area 54 perhaps silicon which is doped with As is removed.

After this, by means of a total surface etching, the areas 53, 55 and 56 of polycrystalline silicon as well as the active areas which are not covered by polycrystalline silicon are freed of oxide. In the case of a following oxidation, third insulating layers 52''' and 52''' arise. At the same time, the As doping diffuses out of the polycrystalline silicon of the bit line 55 in the area of the window 54 into the substrate 50 and forms the zone 57.

Then a third conducting layer of polycrystalline silicon is deposited and is structured for the formation of the transfer gates 58, 59 of the MOS transistors of the corresponding one transistor memory cells. The oxide layer 52'', which represents the gate oxide of transfer transistors, preferably has a thickness of 1000 Å. The method of production proceeds then with known process steps for the production of sourcedrain areas of the MOS transistors, depositing of a further insulating area 60, and the construction of contact holes for metallic coatings in conventional manner.

Figure 2:
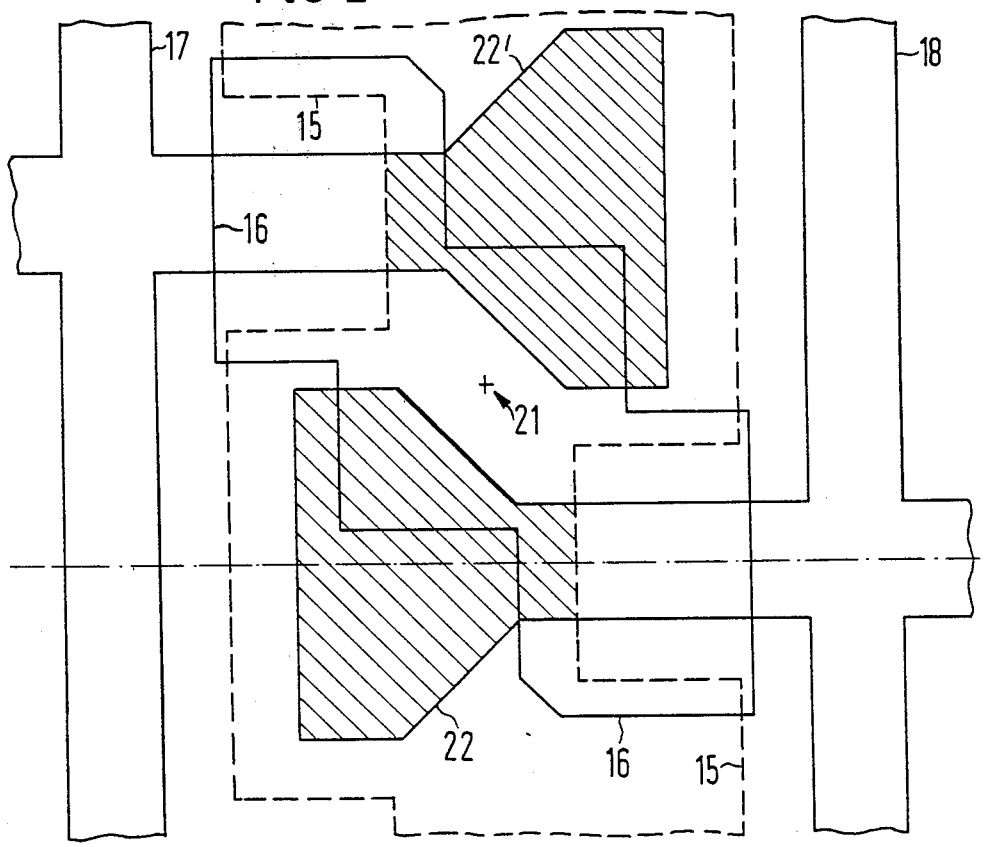
Figure 3:
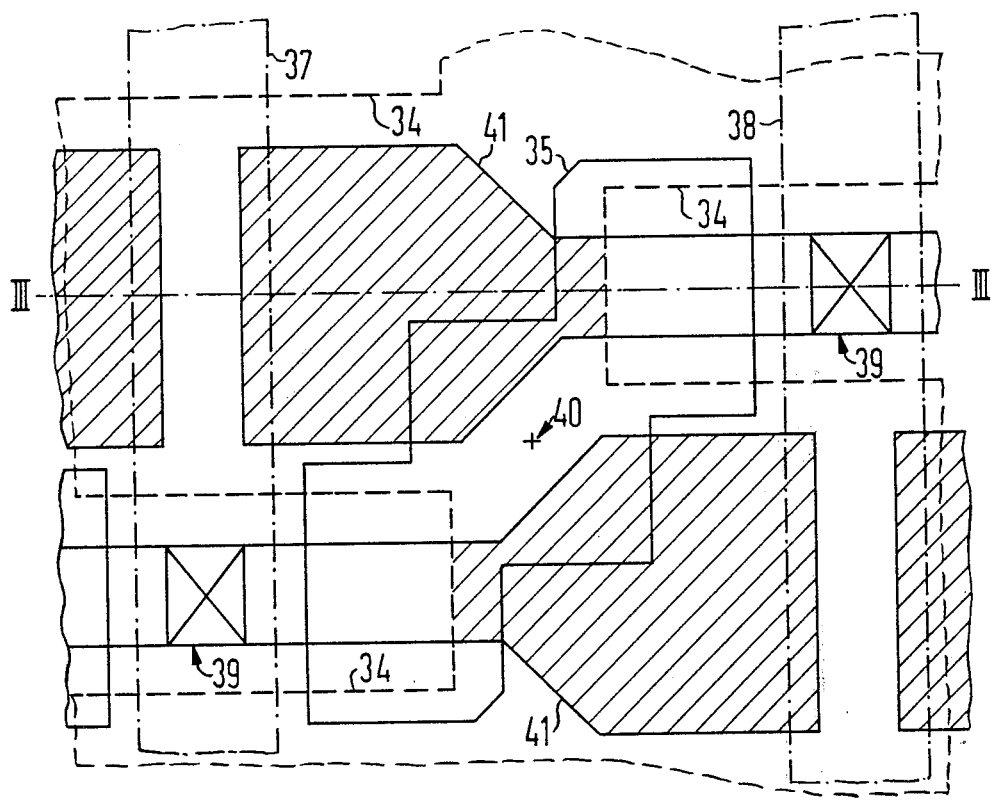
FIG. 3 shows a top view of a portion of a first embodiment of the semiconductor memory according to the invention.
Figure 4:
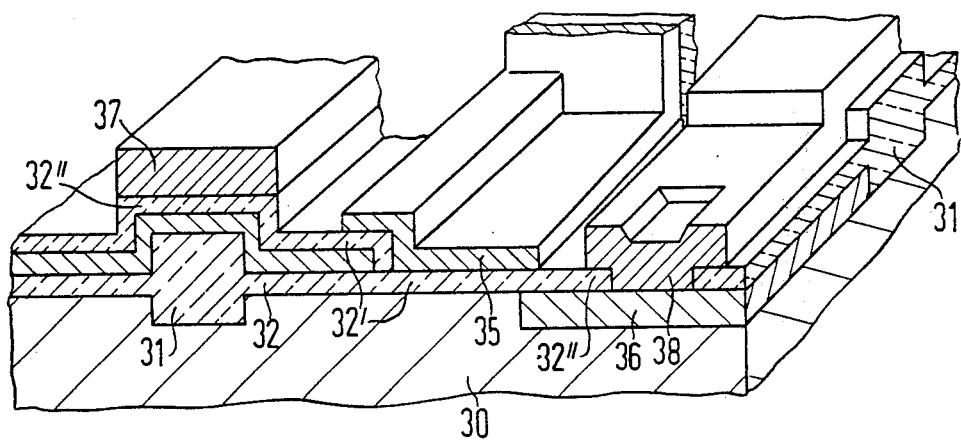
FIG. 4 shows a perspective view of the semiconductor memory according to FIG. 3 along a section plane III—III in FIG. 3.

By the selection of a distance which is designated in FIGS. 5 and 8 with d, the capacitance between the bit lines 37, 38 and electrodes 34 or between bit lines 55, 56 and electrodes 53, can be significantly reduced, whereby again the read signal can be raised. With respect to the known semiconductor memories as they are represented in the FIGS. 1 and 2, this results in a significant advantage, since there the capacitances are established by means of doping profiles. For example, the insulating layers 32'', or respectively, 52' according to FIG. 5, or FIG. 8, respectively have a thickness d of 1500 Å.

The drawing figures only are of a schematic nature, in order to be able to explain the connections by overview. In connection with the explanations above, however, they show the features important to the invention in a sufficiently clear manner.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. An MOS integrated semiconductor memory, comprising: a semiconductor substrate; a plurality of memory locations arranged in lines and columns; each memory location having two one-transistor memory cells on the substate; each memory cell comprising an MOS memory capacitor and an MOS transistor; a word line running in the line direction arranged to control gates of the two one-transistor memory cells of a memory location; the two MOS transistors at each memory location each being coupled to a respective bit line which runs at one side of the memory location in the column direction and between two adjacent columns; for each one-transistor memory cell at the memory location an electrode of the MOS memory capacitor being formed by a first polysilicon layer and a gate of the MOS transistor being formed by a second polysilicon layer; the bit line associated with each one-transistor memory cell being formed by a third polysilicon layer as a polysilicon path; each bit line being coupled to the MOS transistor of each one-transistor memory cell by a respective limited doped connection zone in the semiconductor substrate; and at each memory cell one of the polysilicon layer bit lines being positioned in insulated fashion over the first polysilicon layer which forms the electrode of the memory capacitor of the respective one-transistor memory cell, the first polysilicon layer passing completely under the bit line separating the two adjacent columns of memory cells and directly connecting electrodes of the MOS memory capacitors in at least one memory cell in each of the two adjacent columns.

2. A semiconductor memory according to claim 1 wherein the first, second, and third polysilicon layers are separated from each other by insulating layers.

3. A semiconductor memory according to claim 2 wherein each of the bit lines provided as said third polysilicon layer above the substrate extends down into contact with the doped connection zone of one of the memory cells and wherein another portion of the bit line is positioned over the capacitor electrode first polysilicon layer of the other memory cell and separated therefrom by an insulating layer.

* * * * *